United States Patent [19]

Black

[11] 4,019,248

[45] Apr. 26, 1977

[54] HIGH VOLTAGE JUNCTION SEMICONDUCTOR DEVICE FABRICATION

[75] Inventor: Christopher Thurson Black, Bedford, England

[73] Assignee: Texas Instruments Incorporated, Dallas, Tex.

[22] Filed: June 16, 1975

[21] Appl. No.: 587,516

[30] Foreign Application Priority Data

June 14, 1974 United Kingdom ............ 24680/74

[52] U.S. Cl. .................................. 29/583; 29/580; 29/588; 357/55
[51] Int. Cl.² ........................................ B01J 17/00
[58] Field of Search .................... 29/580, 583, 588; 357/55

[56] References Cited

UNITED STATES PATENTS

| | | | |
|---|---|---|---|
| 3,112,850 | 12/1963 | Garibotti | 29/580 |
| 3,421,922 | 10/1969 | Legat | 29/580 |
| 3,559,006 | 1/1971 | Otsuka | 29/580 |
| 3,596,348 | 8/1971 | Solihull | 29/583 |
| 3,738,877 | 6/1973 | Davisohn | 29/580 |
| 3,750,269 | 8/1973 | Small | 29/580 |
| 3,795,045 | 3/1974 | Dumas | 29/583 |

*Primary Examiner*—W. Tupman
*Attorney, Agent, or Firm*—Harold Levine; Richard L. Donaldson; James T. Comfort

[57] ABSTRACT

The peripheral boundary of a plane pn junction of a semiconductor device, for example, the base-collector junction of a transistor, that is required to withstand high reverse voltages in operation of the device is defined by a channel having a side-wall defining the peripheral boundary of the junction. The channel is formed by firstly mechanically cutting a desired contour channel into a surface of a semiconductor body which has the junction formed therein. The channel is then subjected to chemical etching to remove semiconductor material damaged as a result of the mechanical cutting step and the channel is filled with an insulating glass to provide a protective coating over the pn junction and prevent contamination of the junction by a subsequently applied epoxy resin encapsulant for the device.

20 Claims, 8 Drawing Figures

HIGH VOLTAGE JUNCTION SEMICONDUCTOR DEVICE FABRICATION

This invention relates to an improved method of shaping and passivating a semiconductor junction. The shaping of the junction provides a desired electric field configuration in the region of the junction and passivation ensures that the junction characteristics are not degraded by any material which is used to encapsulate the device.

Breakdown in semiconductor devices often occurs at places where the junction meets the surface of the semiconductor, and for convenience in the following description such places are referred to as the boundaries of a junction. Steps are normally taken during the fabrication of junction semiconductor devices to ensure that junction boundaries are formed in a particular manner, and the whole surface is then protected by a passivating layer from attack by other materials such as encapsulating epoxy resins. The junctions in a planar structure all terminate at a common surface, which permits the protection of all junction boundaries by a layer of silicon dioxide, but the curvature in junctions occurring in planar devices does not permit high-voltage operation.

High-voltage devices up to now have been mesa structures in which the high voltage junction, that is the collector-base junction is plane throughout, the structure being shaped by etching to provide a uniform electric field in the region of the junction boundary. This shaped junction is most easily passivated by a silicon rubber or varnish, but such materials permit the penetration of constituents of epoxy resins, and are therefore not suitable for use with epoxy resin encapsulation. This has meant that up to now, high-voltage junction semiconductor devices have had to be encapsulated in hermetic packages which are expensive. High-voltage devices are those capable of withstanding correctly applied voltages in excess of 1000 volts.

U.S. Pat. No. 3,772,577 issued Nov. 13, 1973 to William B. Planey and assigned to Texas Instruments Incorporated, discloses a high voltage semiconductor device wherein a transistor base region is surrounded by a moat which may be filled with an insulating material such as a passivating varnish, silicon dioxide or insulating glass. The Planey patent teaches that the moat is defined by a chemical etching process. However, using this method, problems have arisen in volume production of satisfactory devices in a reliably consistent manner.

It is an object of the present invention to provide an improved process for fabricating a junction semiconductor device such that the device is capable of withstanding high voltages.

According to the invention there is provided a method of producing a shaped junction in a junction semiconductor device which method includes the step of mechanically cutting a closed channel through a semiconductor body in which the junction has been formed, thereby defining the boundary of the junction and defining the junction semiconductor device as an island surrounded by the channel, wherein the included angle between the side of the channel bounding the device and the surface of the junction semiconductor device is not greater than a right angle.

The included angles between the sides of the channel and the surface of the semiconductor body may be acute angles or they may be right angles. The channel may be of uniform transverse cross-section throughout or the transverse cross-section may vary in shape or size. The slope of the side of the channel bounding the device may be constant or it may vary in a predetermined manner. The walls of the channel may be substantially parallel or they may diverge within the semiconductor body.

After the mechanical cutting the channel is then further treated by chemical etching to remove mechanical damage from the junction boundary. Etching leads to an increase in the size of the channel accompanied by some alteration in the slope of the channel walls.

The channel may be formed by intersecting sets of parallel grooves. Mechanical cutting may be performed by a jet of air or water loaded with an abrasive, by means of an ultrasonically agitated tool, or a diamond-loaded saw blade.

The formation of certain channel shapes may require multiple cuts to be made either by a number of cutting operations or by the use of multiple cutters.

The channel is preferably filled with an insulating glass to permit encapsulation of the device in an epoxy resin. A suitable glass is composed of 50% lead dioxide, 40% silicon dioxide and 10% aluminum oxide or the equivalent.

The semiconductor body may include a high-resistivity layer and a low-resistivity layer, the junction being formed between the high-resistivity layer and a further layer of opposite conductivity type. The further layer may be a diffused layer or it may be an epitaxial layer. In a junction bipolar transistor the junction referred to would be the collector-base junction, in which case this junction would extend substantially parallel to the surface of the transistor.

The high-resistivity layer may be an epitaxial layer that is grown on a low-resistivity substrate, or the combination of high resistivity and low resistivity layers may be formed by starting with a high-resistivity slice and forming by diffusion a low-resistivity layer of the same conductivity type.

Alternatively, the combination of high resistivity and low-resistivity layers may be obtained by starting with a high-resistivity slice, growing on it a low-resistivity polycrystalline semiconductor layer and then lapping down the high-resistivity material to the desired thickness.

The junction semiconductor device may be a bipolar transistor having the junction formed between an epitaxial layer of one conductivity type and an epitaxial base region of the opposite conductivity type. Alternatively, the base region may be diffused into the epitaxial layer.

In the production of junction bipolar transistors, slices of semiconductor material are treated to provide the necessary layers of appropriate conductivity and type for the collector, base and emitter regions. The collector base junction boundaries are then formed by mechanical cutting followed by etching to remove damaged semiconductor material, and the junction passivated by a glass. The slice is then cut up to provide individual transistor chips.

A bipolar transistor produced by the method can be a high-voltage device capable of withstanding voltages in excess of 1000 volts. The semiconductor material used is preferably silicon.

A silicon bipolar transistor fabricated in accordance with the invention will now be described by way of example only and with reference to the accompanying drawings.

Figure 1:
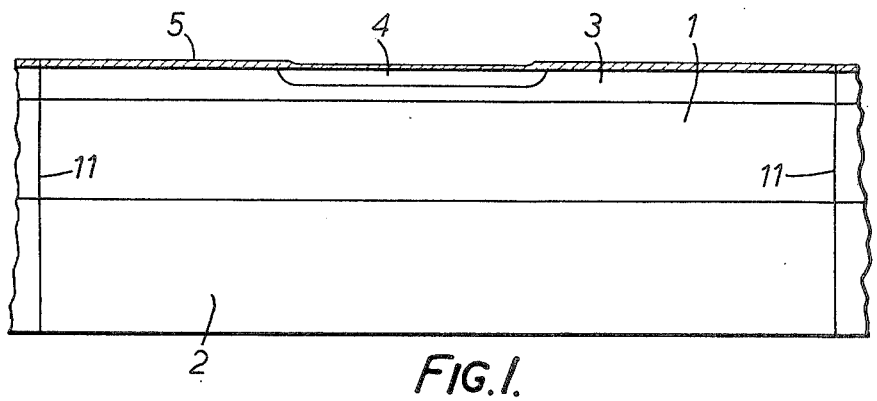
FIG. 1 represents a cross section of a chip in a semiconductor slice when the diffusion steps have been completed.

The structure shown in FIG. 1 represents a single square or rectangular chip in a semiconductor slice, the limits of the chip being the lines 11 which represent lines along which the slice is scribed to obtain the chip. The slice is processed before being divided into chips which all have the structure represented by FIG. 1.

The structure represented by FIG. 1 may be produced in a number of ways.

The substrate 2 may be the starting point. This is low-resistivity material produced by doping the silicon with a high impurity concentration, this being designated $N^+$ for an $N-$ type material. A high-resistivity layer of $N-$ type material is then formed on the substrate 2 by epitaxial growth to provide the collector layer 1. The base region 3 of $P-$ type material is then formed either by diffusion into the collector layer 1 or by the growth of a further epitaxial layer on the existing collector layer 1. These steps lead to a semiconductor slice having three layers as indicated. Emitter regions, such as 4, are then formed by diffusion or ion implantation, for example, the emitters being of $N-$ type material.

Alternatively the high-resistivity region 1 can be the starting point, the layer 2 being formed by the deep diffusion of an $N-$ type impurity into the underside of the region 1 to create the $N^+$ region 2. The base 3 is then formed by diffusing a $P-$ type impurity into the layer 1, and the emitter 4 subsequently formed by another diffusion step.

A further method of obtaining the structure of FIG. 1 is to begin with a high-resistivity $N-$ type slice on which is grown a low resistivity polycrystalline epitaxial layer to give the layer 2. The $N-$ type slice is then lapped down to the combined thickness of layers 1 and 3, and the base and emitter diffusions performed to define the collector layer 1, the base layer 3 and the emitter region 4.

Silicon slices each consisting of adjacent layers of N, P and N type material are thus provided. Alternative series of processes resulting in the same semiconductor configuration could be used instead of the three given above if desired.

Figure 2:
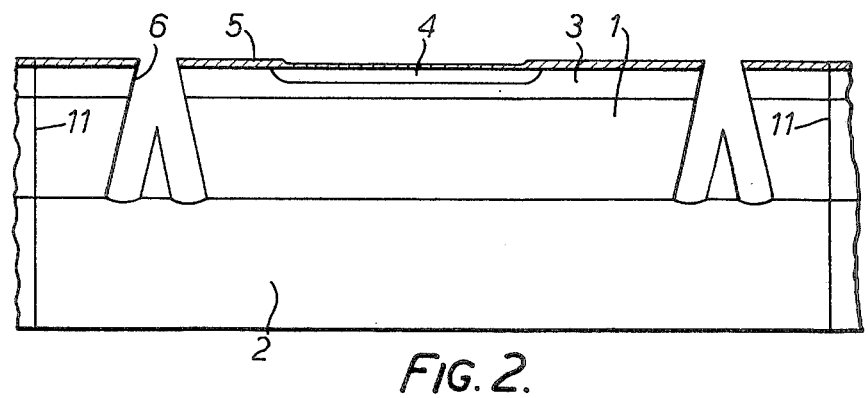
FIG. 2 represents a cross section of the chip shown in FIG. 1 and shows a channel mechanically cut into the chip.

The next step is shown in FIG. 2 where a channel 6 has been mechanically cut in the device, creating an island containing the emitter 4. The channel has a rectangular periphery which is defined by a set of intersecting cuts. The channel 6 extends through the collector layer 1 and terminates near the interface between the collector layer 1 and the substrate region 2. Forming the channel by cutting permits the introduction of a channel with sloping sides, as shown, whereas a chemically etched channel would have a semi-circular section. The semicircular section channel cannot provide a high-voltage device because it leads to the formation of high potential gradients in the electric field at certain points at moderate applied potentials.

The channel shown in FIG. 2 increases in width from top to bottom when the chip is viewed as drawn, that is, with the emitter area uppermost. This shape channel may be obtained by making cuts with angled saws into the surface of the slice. The channels are defined by intersecting sets of parallel grooves forming a uniform grid pattern over the surface of the slice, but the channels do not represent the boundaries of the chips. The circumscribing lines 11 represent the boundaries of the chips shown in the Figures, indicating that the chip boundaries lie outside the channels. The channels extend through the epitaxial layer 1 which together with the layer 3 and the emitter region 4 form the semiconductor body, the junction being the common surface between the collector layer 1 and the base layer 3. The channels therefore surround the semiconductor devices which appears as islands in the slice.

Further processing requires chemical etching of the channels to remove damaged semiconductor material and to provide surfaces free of damage at which the collector base junctions terminate. A suitable etch composition is, by volume, concentrated $HF$ 24.1 percent, $HNO_3$ 59.4 percent, and $CH_3OOH$ 16.5 percent. The channel is then filled with an insulating glass which protects the active collection-base junctions. A suitable glass is one containing 50% lead oxide, 40% silicon dioxide and 10% aluminum oxide. Such a glass is impervious to the constituents of epoxy resins.

Figure 3:
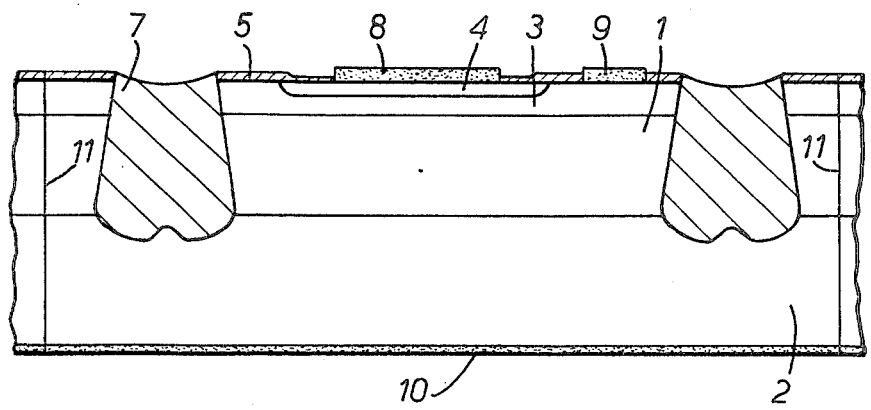
FIG. 3 represents a cross section of the completed junction semiconductor device obtained from the chip shown in FIG. 2 after etching and filling the channel and adding metallization contacts.

The resultant device is shown in FIG. 3 where the channel surrounding a transistor has been widened and deepened by the chemical etch, and the slope of the channel walls has become more nearly perpendicular to the surface of the chip. The channel is filled with glass 7. The device is completed by providing metallization contacts 8, 9 and 10 for the emitter, base and collector respectively.

Figure 4:
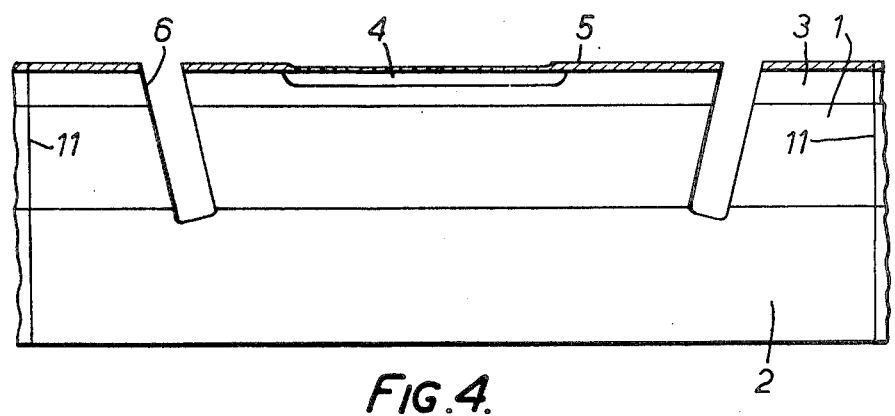
FIG. 4 represents a side view of the chip shown in FIG. 1 with a modified form of channel cut into the chip.
Figure 5:
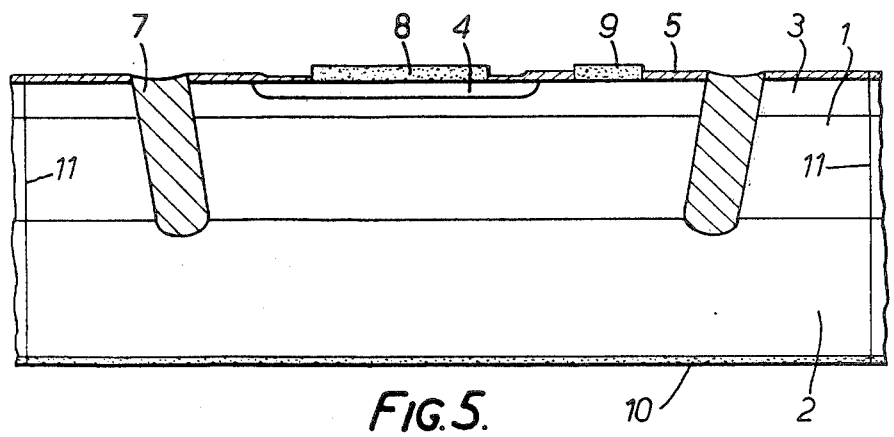
FIG. 5 represents a side view of the completed junction semiconductor device obtained from the chip shown in FIG. 4, after etching and filling the channel and adding metallization contacts.

A semiconductor device of substantially the same shape as that shown in FIG. 2 may be provided by angled saw cuts as illustrated in FIG. 4. The channel walls are shown substantially parallel, but they may be tapered slightly, provided that the channel walls forming the sides of the semiconductor device define an acute included angle with to the surface of the semiconductor device. It can be seen that the semiconductor device appears as an island surrounded by the channel, the surface of the semiconductor device being the surface of the island.

The channel is then etched to remove damaged semiconductor material, as before, and filled with a glass to give the result shown in FIG. 3, where metallization contacts 8, 9 and 10 are also shown.

Figure 6:
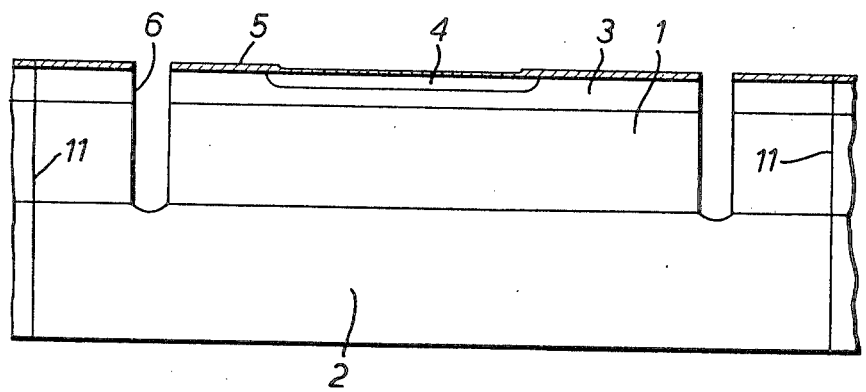
FIG. 6 represents a side view of the chip shown in FIG. 1 with another form of channel cut into the chip.
Figure 7:
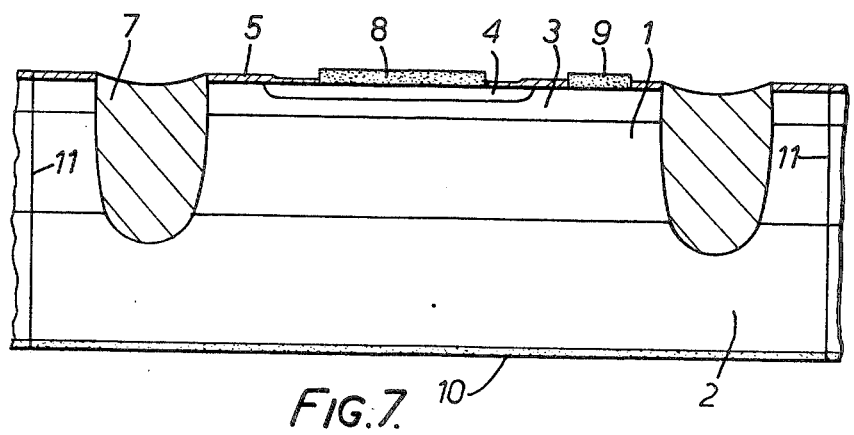
FIG. 7 represents a side view of the completed junction semiconductor device obtained from the chip shown in FIG. 6, after etching and filling the channel and adding metallization contacts.

A channel having walls which are at right angles to the surface of the semiconductor device is shown in FIG. 6. Subsequent etching and filling of the channel with a glass, and the addition of metallization contacts leads to the chip shown in FIG. 7.

It will be appreciated that the above-described fabrication operations are carried out prior to separation of the slice into individual chips.

Conventional scribing techniques cannot be used to cut the slices into separate chips because there would be a tendency for separation to occur along the channels rather than along scribe lines. It is therefore necessary to divide the slices into chips by deep scribing using a laser scriber or by means of a mechanical saw.

After the slices have been separated into individual device chips, the devices can be encapsulated in an epoxy resin, the glass-filled channels preventing contamination of any of the semiconductor surfaces at which the base-collector junction of the device terminates.

The method therefore enables the manufacture of a high voltage junction transitor at low cost.

Figure 8:
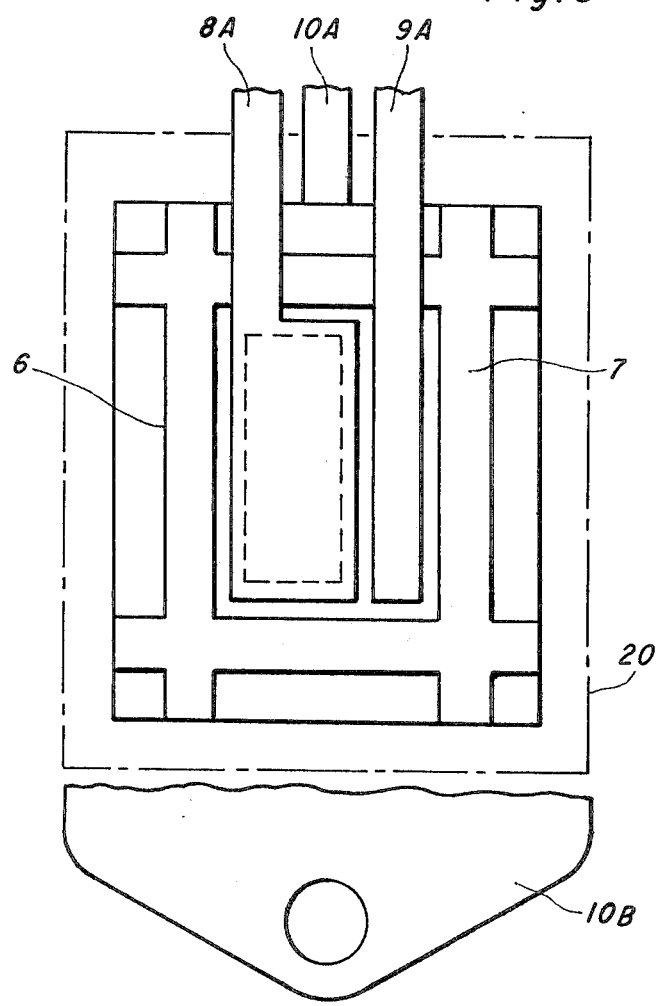
FIG. 8 is a top plan view of a device as shown in FIG. 7 following encapsulation thereof.

FIG. 8 shows, in diagramatic plane view, a transistor fabricated in accordance wth the invention. The structure corresponds generally with that shown in FIG. 7 following encapsulation in an epoxy resin package 20, the emitter, base and collector contacts 8, 9 and 10 being connected with corresponding terminals 8a, 9a and 10a, the latter also providing a heat sink 10b extending over the underside of the package.

What is claimed is:

1. In a method of fabrication semiconductor devices having a junction capable of withstanding high reverse voltages, the steps of:
    a. providing at a surface of a semiconductor body a first semiconductor region of one conductivity type in a second semiconductor region of opposite conductivity type to define a junction therebetween;
    b. mechanically cutting a plurality of closed contour channels extending through said first semiconductor region and into said second region but only partly through the thickness of said semiconductor body to define respective plane areas of said junction each said area having a peripheral boundary defined by a wall portion of a respective said channel, wherein said wall portion of each said channel and said semiconductor body surface define a substantially constant included angle not greater than a right angle;
    c. chemically etching surfaces of said channels to remove semiconductor material damaged by said mechanical cutting;
    d. filling each said channel with an insulating glass for passivating said junction;
    e. separating said semiconductor body into individual chips each having a peripheral boundary within which a said closed contour channel is located and spaced therefrom; and
    f. encapsulating said chip in a moldable electrically insulating synthetic resin material against which said insulating glass provides a barrier to contamination of said junction by said encapsulating material thereby enabling said junction to withstand high reverse voltages.

2. A method as set forth in claim 1, wherein each said channel has oppositely sloped side-wall portions.

3. A method as set forth in claim 1, wherein each said channel has a substantially symmetrical transverse cross-section.

4. A method as claimed in claim 1, wherein each said channel has parallel side-wall portions.

5. A method as set forth in claim 1, wherein said channel has side-wall portions substantially orthogonal to said surface of the semiconductor body.

6. A method as claimed in claim 1, wherein said channels are formed by cutting intersecting sets of substantially plane-walled parallel grooves into said surface of said semiconductor body.

7. A method as claimed in claim 7, wherein said mechanical cutting of said channels is effected by erosion of said semiconductor surface using a jet of fluid loaded with an abrasive.

8. A method as set forth in claim 1, wherein said mechanical cutting of said channels is effected by use of an ultrasonic cutter.

9. A method as set forth in claim 1, wherein said mechanical cutting of said channels is effected using a diamond-loaded saw blade.

10. A method as set forth in claim 1, wherein said semiconductor body comprises a silicon body and wherein said insulating glass consists of about 50% lead dioxide, 40% silicon dioxide and 10% aluminum oxide.

11. A method as set forth in claim 10, wherein said mechanical cutting of said channels is effected by cutting intersecting pairs of grooves into said surface of said semiconductor body to define channels each having a quadrilateral boundary.

12. In a method of fabricating bipolar junction transistors including a base-collector junction capable of withstanding high reverse voltages, the steps of:
    a. providing at a surface of a semiconductor body a first semiconductor region of one conductivity type in a semiconductor region of opposite conductivity type to define a pn junction therebetween;
    b. mechanically removing semiconductor material from said first and second regions to define a plurality of closed contour channels extending through said first region and into said second region to define respective portion of said first region and respective plane areas of said junction, each said area peripherally bounded by a wall portion of a respective said channel, said wall portion defining with said surface of said semiconductor body a substantially constant included angle not greater than 90°, degrees, each portion of said first region defining a base region of said transistor and each said plane area of said junction forming a base-collector junction for a said transistor.
    c. subjecting said channels to chemical etching to remove semiconductor material damaged by said mechanical removal of semiconductor material;
    d. filling said channels with an insulating glass to provide a protective covering for said base-collector junctions.
    e. separating said semiconductor body into individual chips each having a peripheral boundary within which said closed contour channel is located and spaced therefrom; and
    f. encapsulating said chips in a moldable electrically insulating synthetic resin material against which said insulating glass provides a barrier to contamination of said junction thereby enabling said transistors to withstand high base-collector reverse voltages 13. A method as set forth in claim 12; wherein said included angle is less than 90°.

14. A method as set forth in claim 12; wherein said channels are formed by removal of semiconductor material to define two sets of spaced parallel grooves to form channels each having a quadrilateral periphery.

15. A method as set forth in claim 12, wherein said channels have substantial plane side-walls divergent from said semi-conductor body surface.

16. In a method of fabricating bipolar junction transistors having a base-collector junction capable of withstanding high reverse voltages, the steps of:
a. forming a semiconductor body having a first layer of one conductivity type and relatively high resistivity and an adjacent second layer of said one conductivity type and relatively low resistivity;
b. forming a surface region of opposite conductivity type in said first layer and forming spaced apart doped surface regions of said one conductivity type in said surface region to provide emitter regions for said transistors;
c. mechanically removing semiconductor material from areas of said first region and an underlying portion of said first layer to define a plurality of closed contour channels extending through said first region and through said first layer into said second layer such that each channel circumscribes and is spaced from a respective said emitter region and has a first wall portion defining the peripheral boundary of portion of said first layer and said first region to provide respectively a collector region and a base region for said transistor, said first wall portion further defining the peripheral boundary of a plane pn junction between said base and collector regions, said first wall portion having a substantially constant included angle with said surface of said semiconductor body that is not greater than 90°;
d. subjecting said channels to chemical etching to remove semiconductor material damaged by said mechanical removal of semiconductor material and thereby widen said channels;
e. filling said widened channels with an insulating glass to form a protective covering over said peripheral boundary of the junction between said base and collector regions for protecting said junctions;
f. separating said semiconductor body into individual chips each having a peripheral boundary within which a said closed contour channel is located and spaced therefrom; and
g. encapsulating said chips in a moldable electrically insulating epoxy resin against which said insulating glass provides a barrier to encapsulant contamination of said junction thereby enabling said transistors to withstand high base-collector reverse voltages.

17. A method as set forth in claim 16, wherein each said channel has a substantially symmetrical transverse cross-section.

18. A method as set forth in claim 16, wherein each said channel has oppositely sloped planar side-wall portions divergent away from said surface of said semiconductor body such that said included angle is less than 90°.

19. A method as set forth in claim 16, wherein said semiconductor body is silicon body and said chemical etch comprises a concentrated hydrofluoric acid, nitric acid and methyl alcohol.

20. A method as set forth in claim 19, wherein said insulating glass consists essentially of 50% lead oxide, 40% silicon dioxide and 10% aluminum oxide.

* * * * *